United States Patent [19]

Goth et al.

[11] Patent Number: 4,589,193
[45] Date of Patent: May 20, 1986

[54] METAL SILICIDE CHANNEL STOPPERS FOR INTEGRATED CIRCUITS AND METHOD FOR MAKING THE SAME

[75] Inventors: George R. Goth; Thomas A. Hansen; Robert T. Villetto, Jr., all of Poughkeepsie, N.Y.

[73] Assignee: International Business Machines Corporation, Armonk, N.Y.

[21] Appl. No.: 626,278

[22] Filed: Jun. 29, 1984

[51] Int. Cl.[4] ............... H01L 21/76; H01L 21/94
[52] U.S. Cl. ................... 29/576 W; 29/578; 29/580; 148/DIG. 19; 148/DIG. 85; 148/DIG. 86; 357/49
[58] Field of Search ............ 29/576 W, 580, 578; 148/DIG. 19, 147, 50, 117, DIG. 85; 427/88; 357/49, 67 S

[56] References Cited

U.S. PATENT DOCUMENTS

| | | | |
|---|---|---|---|
| 3,381,182 | 4/1968 | Thornton | 317/234 |
| 3,653,120 | 4/1972 | Sirrine | 29/589 |
| 4,446,476 | 5/1984 | Isaac et al. | 357/67 S |
| 4,471,525 | 9/1984 | Sasaki | 29/576 W |
| 4,473,598 | 9/1984 | Ephrath et al. | 29/576 W |
| 4,476,622 | 10/1984 | Cogan | 29/578 |
| 4,519,128 | 5/1985 | Chesebro et al. | 29/576 W |
| 4,549,927 | 10/1985 | Goth et al. | 29/576 W |

OTHER PUBLICATIONS

Abbas, "Recessed Oxide Isolation Process" IBM Technical Disclosure Bulletin vol. 20, No. 1 6/77.
IBM TDB Dec. 1981 pp. 3841-3843.
IBM TDB May 1983 pp. 6611-6614.
IBM TDB Jan. 1983 pp. 4405-4406.

Primary Examiner—Brian E. Hearn
Assistant Examiner—Hunter L. Auyang
Attorney, Agent, or Firm—Robert J. Haase

[57] ABSTRACT

Disclosed is the use of metal silicide (e.g. Pt-Si) contacts in boron lightly doped P− type silicon between two contiguous but not adjacent N+ type regions instead of employing the usual P+ implanted or diffused channel stoppers. The invention finds a particularly interesting application in polyimide filled deep trench isolated integrated circuits.

The trench sidewalls are coated with an insulating material which is removed from the trench bottom at the all contact etch step. The Pt-Si is formed at the bottom of the trenches at the same time that the device contacts are made.

12 Claims, 9 Drawing Figures

METAL SILICIDE CHANNEL STOPPERS FOR INTEGRATED CIRCUITS AND METHOD FOR MAKING THE SAME

REFERENCE TO A COPENDING APPLICATION

The present application is related to patent application Ser. No. 626,271 filed concurrently by G. R. Goth, T. A. Hansen and J. S. Makris for "Method of selectively exposing the sidewalls of a trench and its use to the forming of a silicide substrate contact for deep trench isolated devices".

BACKGROUND OF THE INVENTION

1. Field of Invention

The present invention relates to a method of producing channel stoppers for integrated circuits and more particularly to a method for forming metal silicide channel stoppers for dielectric filled deep trench isolated devices.

2. Description of the Prior Art

Channel inversion is one of the most common and important problem in the field of oxide-isolated or oxide-passivated semi-conductor integrated circuits manufacturing. The problem typically arises when two N (or N+) type, adjacent but not contiguous, regions formed in a P− type silicon substrate, are passivated by an oxide layer. Usually occurring at the interface between the P type silicon and the passivating oxide, channel inversion may result from a wide variety of factors: presence of certain impurities such as sodium ions in the oxide, influence of an overlying metallization pattern, affinity of boron dopants to segregate into an silicon dioxide layer, ..., etc. Channel inversion causes those regions to be electrically connected by a N type channel formed at the surface of said P+ type silicon substrate. In many instances, this connection is not desired and results in degradation of electrical performances of devices.

More recent trends in micro-electronics, which capitalize both, on dielectric isolation and general use of lightly doped substrates, make advanced devices more sensitive to channel inversion problems caused by the third factor mentioned above (affinity of boron dopants to segregate), for reasons which will be briefly commented thereafter.

According to that particular type of dielectric isolation, patterns of dielectrically filled trenches extending from the surface of the integrated circuit to the interior thereof, are advantageously used to isolate the devices (one bipolar transistor from another bipolar transistor) or portions of the devices (the base region from the collector region in a bipolar transistor). Because this technique considerably increases the integration density, it is now widely practiced.

On the other hand, silicon wafers have lightly doped substrates in order to significantly reduce collector-substrate capacitances, which in turn increases the operating frequencies of the devices.

In a typical example of manufacturing such advanced integrated circuits, the initial structure is a P+ substrate having a blanket (or discrete) N+ subcollector and a N+ epitaxial layer thereon. Using standard photo lithographic and Reactive Ion Etching (RIE) techniques, trenches are formed through the N+ epitaxial layer into the P+ substrate. Following etching, a thin (50–150 nm) thermal $SiO_2$ layer is regrown in trenches to cover the trench sidewalls. While $SiO_2$ regrowth is optional, it is extensively practiced. It is used as an underlying layer for the subsequent dielectric to be filled in the trenches. The growth of thin oxide layer can be detrimental to the distribution of dopants in the underlying silicon, near the oxide silicon interface, principally with P+ type silicon. Unlike phosphorous atoms which have the the tendency to pile up or accumulate on the silicon side of the interface (so called snow-plow effect), boron has a stronger affinity for silicon dioxide than for silicon. Thus, during oxide growth, the concentration of boron near the surface of said P− substrate tends to decrease because migration of boron atoms into silicon dioxide. As a result, there does exist a very thin N− type inverted layer superficially in the P− substrate at the bottom of the trench. Therefore, following $SiO_2$ regrowth, a standard ion implantation is conducted, and boron is implanted into trenches to form P+ channel stopper regions at the bottom of the trenches. The ion implantation is highly directional in the vertical direction and is performed at ∼30 keV to provide a boron concentration of ∼$1 \times 10^{17}$ at/cm$^3$. More often than not, the sidewalls of the trenches receive a $Si_3N_4$ barrier layer before the trenches be filled either with $SiO_2$ (by Chemical Vapor Deposition) or polyimide (by spinning). The process is completed by the conventional formation of active and passive devices until the whole structure is achieved.

The primary function of a channel stopper is, of course, to prevent undesirable effects caused by channel inversion, and it may have only this function as clearly mentioned for example by S. Magdo, IBM Technical Disclosure Bulletin, volume 24, No. 7B, December 1981, pages 3841 through 3843 (ref.1). In this disclosure, after the channel stoppers have been formed, the trenches are filled with oxide.

However in others applications, the channel stopper may also play the additional role of a buried substrate contact. This technique is described for example by S. A. Abbas et al, IBM Technical Disclosure Bulletin, Vol. 25, No. 12, May 1983, pages 6611 through 6614 (ref.2) and J. S. Basi et al, IBM Technical Disclosure Bulletin, volume 25, No. 8, January 1983, pages 4405 and 4406 (ref.3). The former article describes the formation of a polysilicon buried conductor for reach through to the P substrate for ohmic electrical contact thereto. Once the trenches have been opened and channel stoppers have been formed, trenches are protected with an insulating layer. Then, the bottom of the trench is opened to expose the channel stopper region and, a thin polysilicon layer is CVD deposited, providing a contact with the substrate. In the latter article, the substrate contact is made by shorting the subcollector to the channel stopper with a platinum silicide lining, and then to the top metallurgy via the collector reach-through diffusion. In Basi et al, the platinum silicide acts only to provide an ohmic contact to the P+ channel stopper.

Both methods do not provide satisfactory substrate resistance as it will be understood thereafter.

In general, the two functions of the channel stopper i.e. prevention of channel inversion and buried substrate contact, are simultaneously used in a silicon chip. A channel stopper is present at the bottom of all trenches, but only some of them will be used as a buried substrate contact.

Unfortunately, formation of said conventional channel stoppers makes an extra ion implantation step necessary. On the other hand, device structures isolated by filling deep trenches with a dielectric material, generally exhibit a problem of high substrate resistance due to the relatively low doping of the channel stop implant in the bottom of the trenches. The channel stop implant dose cannot be increased significantly above $\sim 1.0 \times 10^{13}$ ions/cm$^2$ of $^{11}$B+ without inducing emitter to collector shorts of lateral PNP transistors, butting the trench or between the P base region of an NPN transistor and a spaced apart P base resistor bed. In both cases this P to P leakage is caused by channel inversion of the epitaxial layer at the top of the trench due to undesired introduction of P dopants during the implantation step.

Another reason of limiting the dose is to avoid generation of dislocations. In addition, due to this doping limitation of the channel stop, the prevention of channel inversion effect is not satisfactory when commercially available polyimides are used. Most of them are not pure but contain undesired contaminants.

SUMMARY OF THE INVENTION

The applicant has unexpectedly discovered that the channel stop implant is unnecessary when a metal silicide rectifying contact to the N$^-$ inversion layer is formed at the bottom of all trenches. This technique has demonstrated that it prevents subcollector to subcollector leakage with more efficiency that the conventional channel stop implant. It is to be noted that the metal silicide channel stopper eliminates one processing step: ion implantation of boron atoms to form the channel top implant, in all technologies where metal silicide is used, in others words, in practically all modern semiconductor technologies. Metal silicide such as platinum silicide, is extensively used at present, mainly in the formation of Schottky Barrier Diodes. In addition, the present invention solves the two primary technological problems associated with dielectrically isolated deep trenches which have been mentioned above: the P to P leakage and substrate resistance. More particularly, concerning the latter improving the substrate resistance over the prior techniques, reduces the number of substrate contacts required, which in turn, results in a significant increase of the integration density.

According to the most general concept of the present invention, it is proposed the principle of forming a channel stopper in a lightly doped P$^-$ silicon substrate having two adjacent, but not contiguous N (or N+) regions formed at the surface of the substrate; comprising the step of forming a silicide rectifying contact of an appropriate metal such as platinum, palladium and the like with the substrate in between these regions.

In one preferred embodiment, relating to advanced devices having polyimide filled deep isolation trenches, it is proposed, in accordance with the present invention, a method of forming a channel stopper at the bottom of the trenches formed through the N$^-$ epitaxial layer and the N+ subcollector, into the P$^-$ silicon substrate; said method comprising the steps of: coating the trenches with an insulating layer, removing said insulating layer from the bottom of said trenches and, forming a channel stopper consisting of a silicide rectifying contact by reacting an appropriate metal with the exposed silicon. The preferred metal is platinum. The Pt-Si contact aims therefore, to simply replace the well known P+ channel stopper, which has been extensively used so far. However, this replacement cannot be considered as being obvious for the man skilled in the art. Good demonstration is given by the Basi et al reference, cited above where the Pt-Si substrate contact is made onto the P+ channel stopper. According to the teachings of the present invention, the P+ channel stopper is no longer necessary.

The foregoing and other objects features and advantages of the invention will be apparent from the following more particular description of a preferred embodiment of the invention as illustrated in the accompanying drawings.

DISCLOSURE OF THE INVENTION

In the following description, the present invention is described with reference to the fabrication process of a standard advanced integrated circuit where the active devices to be formed are bipolar transistors and Schottky Barrier Diodes (SBD's), isolated by polyimide filled deep trenches to minimize stress in the silicon substrate. It should be understood, of course, that various others embodiments may be set forth, the present invention being of wide application.

Because the conventional bipolar semiconductor process is followed through the trench formation the initial processing steps will not be detailed thereafter.

Figure 1:
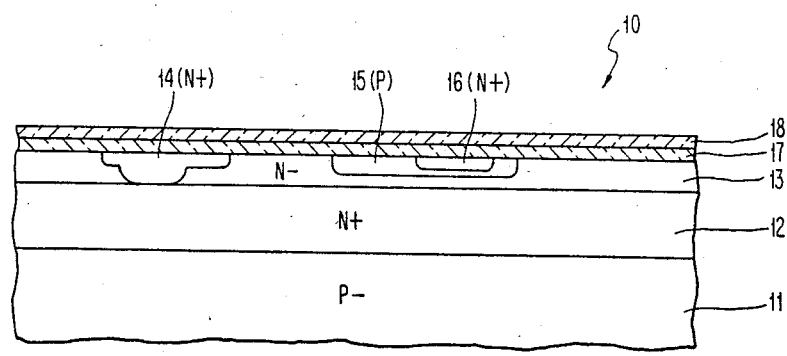
FIG. 1 illustrates a cross sectional view of a standard NPN transistor formed by known methods.

FIG. 1 shows, as a non limitative example, a classic integrated structure 10 which results of those standard processing steps, integrating a NPN vertical transistor. Others devices such as diodes, resistors, etc . . . might have been represented as well. During the subsequent processing steps, an antisaturation Schottky barrier diode will be formed in parallel with the collector-base junction, simultaneously with the formation of the metal silicide channel stopper at the bottom of the trenches.

The initial structure is comprised of a P$^-$ boron doped substrate 11 having a blanket N+ subcollector 12 and N$^-$ epitaxial layer 13 thereon; the latter includes a conventional NPN vertical transistor structure comprised of a N+ reach-through region 14, a P base region 15 and a N+ emitter region 16. The structure is passivated with a composite insulating layer of SiO$_2$ ($\sim$300 nm) and SiN$_4$ ($\sim$170 nm) respectively referenced 17 and 18. The thickness irregularities of both layers which are representative of the thermal history of the chip during the prior processing steps have not been represented here for clarity. The silicon nitride layer usually acts as an oxidation barrier mask to protect the top surface during trench sidewall oxidation.

Figure 2:
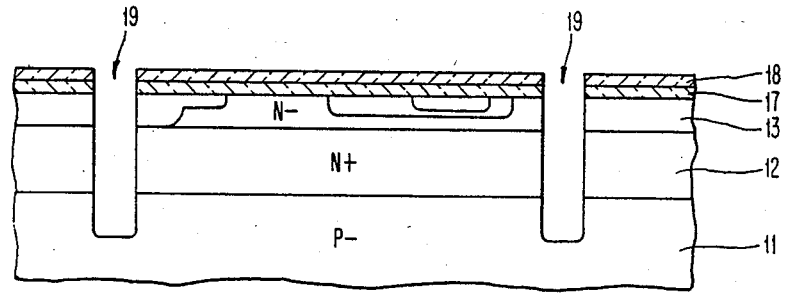
FIGS. 2 to 9 illustrate sectional views of the structure shown in FIG. 1 undergoing fabrication in accordance with the teachings of the present invention.

From that stage, the process proceeds as described in the following steps:

1. Use a resist mask (not represented), to reactive ion etch (in CF4) the Si$_3$N$_4$/SiO$_2$ composite passivation layer to open the areas where trenches are desired; then reactively ion etch in an SF$_6$+Cl$_2$+He atmosphere to form trenches 19 into the substrate 11 to produce the structure shown in FIG. 2. As known, the trenches define isolated pockets or portions of the epitaxial layer where active and/or passive devices and combination thereof are formed.

Figure 3:
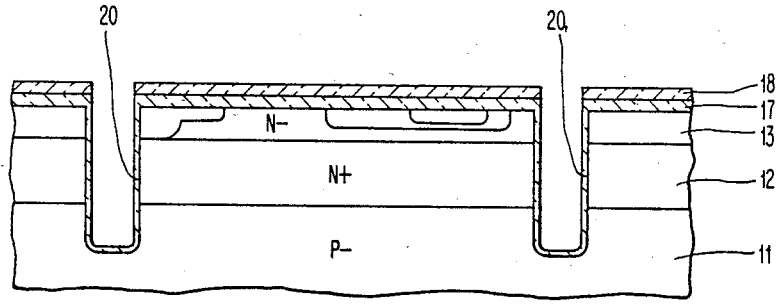

2. Thermally form SiO$_2$ layer 20 (50–150 nm) by conventional techniques to coat the trench sidewalls and bottoms as seen in FIG. 3. As reported previously, boron has a stronger affinity for SiO$_2$ than for silicon, during oxide growth, the concentration of boron, near the exposed surfaces of said boron doped P− substrate at the bottom of the trenches, tends to decrease because migration of boron atoms into the SiO$_2$ layer. As a result, it exists a very thin N− type inverted layer superficially in the P− substrate at the bottom of the trench.

Figure 4:
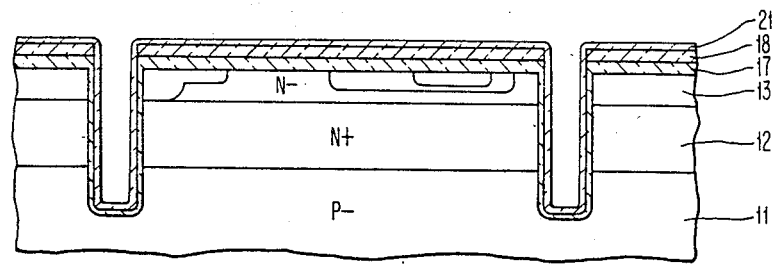

3. Form a blanket Si$_3$N$_4$ passivation layer 21 onto the whole exposed structure by Chemical Vapor Deposition (e.g. plasma) at a low temperature (750°–800° C.) to a thickness of about 50–150 nm as seen in FIG. 4.

Figure 5:
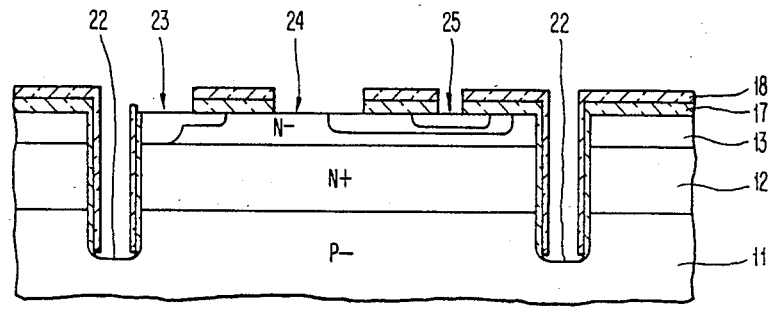

4. Etch all contact openings that require either an ohmic or a rectifying contact. Openings are accomplished by CF$_4$ reactive ion etch removal of exposed Si$_3$N$_4$ and wet etching of SiO$_2$ layers including of course at the bottom of the trenches. According to FIG. 5, four openings 22, 23, 24 and 25 are made respectively at the locations of the bottom of trenches, the collector reach through, the collector-base junction and the emitter.

Figure 6:
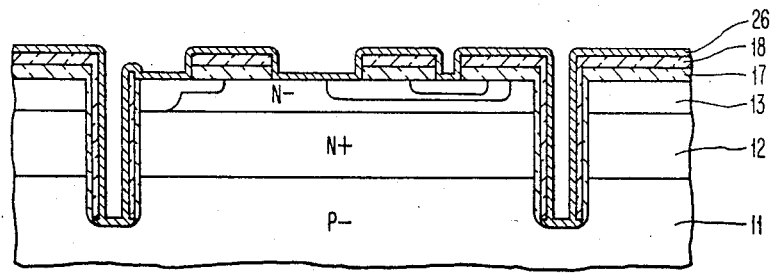

5. Blanket deposit a layer 26 of appropriate metal such as platinum, palladium, or the like onto the FIG. 6 structure. The preferred metal being platinum with a layer thickness in the range of 30–100 nm.

Figure 7:
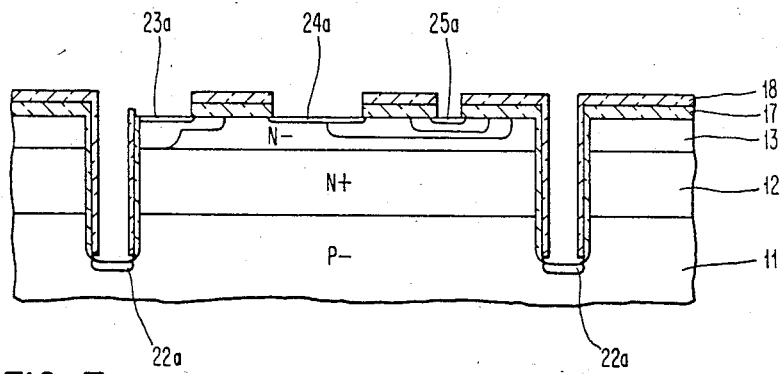

6. Form platinum silicide (Pt-Si) (∼50–150 nm) contacts 22a, 23a, 24a and 25a by a conventional sintering step (∼550° C.) on areas where the metal contacts silicon. The platinum silicide makes an ohmic contact with the highly doped N+ type emitter and collector reach-through regions. It forms a rectifying contact to the N− inversion layer formed at the bottom of the trenches. The metal must penetrate beyond the thickness of said inversion layer. The platinum silicide shorts the collector-base junction, and provides a SBD in parallel with that junction to be used as an antisaturation diode. The contact is ohmic with the base and of Schottky type with the lightly doped collector (anode). Unreacted Pt-Si is removed by wet etching in aqua regia. The resulting structure is shown in FIG. 7.

Figure 8:
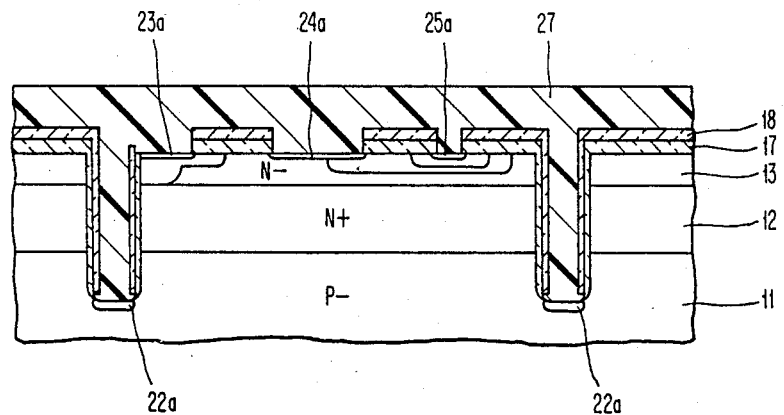
Figure 9:
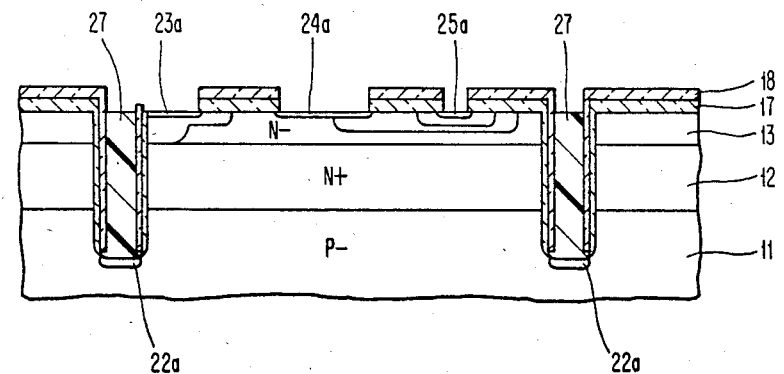

7. Spin on polyimide material 27 to fill the trenches and bake out at 400° C. (FIG. 8). RIE the polyimide in O$_2$, except from the trench, as seen in FIG. 9.

8. Proceeds as standard for further metallization and passivation steps until the final structure is completed.

In the bottom of the trench, the Pt-Si contact acts exactly as an P+ implant channel stopper would have done: it prevents the formation of a N channel in the P− substrate between the two contiguous but not adjacent portions of the epitaxial layer. However, it is based on a completely different principle, and in addition, it presents several advantages not obtainable when the implanted channel stopper is implemented. Because the Fermi level is clamped in the silicon, it is no longer depending on the amount of interface chrges stages in the dielectric. In others words, the Pt-Si contact will force the N type silicon to act like a P type silicon, i.e. the type of conductivity of the surface is clamped to P type.

Among the advantages, one may cite, the avoidance of one processing step: ion implanting the boron atoms to form the channel stopper region. It is to be understood that the invention is implemented without the need of an additional manufacturing step: advanced bipolar structures necessarily imply the use of metal silicide to improve the contacts or to form SBD's.

In addition, the metal silicide channel stopper will be less sensitive to surface state effects than an implanted region.

At last, the substrate resistance is significantly improved as demonstrated by the following figures. Although, the present invention, such as described above does not take directly benefit of this characteristic, because the additional role of the channel stopper as a substrate contact has not been considered here, it has been demonstrated experimentally that the sheet resistance of the channel stopper is reduced from ∼4000 ohms/□ to ∼8 ohms/□ by replacing the conventional implanted channel stopper with the formation of a silicide of a typical contact metal as mentioned above. It is to be understood that the channel stopper of the present invention may be used as a substrate contact with any known methods such as cited above, however, there is no doubt that the preferred method is the one described in the previously mentioned copending patent application.

While there has been shown and described what is considered at present to be the preferred embodiment of the present invention, it will be appreciated by those skilled in the art that modifications of such embodiment may be made. It is therefore desired that the invention not be limited to this embodiment, and it is intended to cover in the appended claims all such modifications as fall within the true spirit and scope of the invention.

What is claimed is:

1. The method of forming a channel stopper at the bottom of an insulating trench formed through a N type conductivity layer into a lightly doped P− silicon substrate in an integrated circuit comprising the steps of
    coating said trench with an insulating layer;
    removing said layer at least from the bottom of said trench; and
    forming a channel stopper solely by depositing an appropriate metal at the bottom of said trench where said insulating layer was removed and sintering said metal with said silicon substrate to form a metal silicide rectifying contact.

2. The method of claim 1 wherein said substrate is doped with boron atoms and said insulating layer is a SiO$_2$ layer.

3. The method of claim 1 or 2 wherein said metal is selected from the group comprising: palladium, platinum and the like.

4. The method of claim 3 wherein said metal is platinum deposited with a layer thickness in the range of 30–100 nm and sintered at about 550° C. to form a platinum silicide rectifying contact.

5. The method of claim 4 wherein said platinum silicide rectifying contact extends beyond the thickness of the inverted layer formed during said coating step.

6. The method of claim 5 wherein the thickness of said platinum silicide rectifying contact is the range of 50–150 nm.

7. The method of claim 1 wherein said substrate is doped with boron atoms and said insulating layer is a SiO$_2$Si$_3$N$_4$ composite layer.

8. In a method of forming deep trench isolated devices, according to which isolation trenches are formed through a passivated N type conductivity layer into a lightly doped P− substrate, defining isolated pockets containing active and/or passive devices, the improvement comprising the steps of:
    coating the sidewalls and bottoms of said trenches with a thermally grown SiO$_2$ layer;

etching all contact openings, at the areas where a contact with the silicon substrate is needed, including said bottoms of trenches;

blanket depositing a layer of an appropriate metal on said areas;

sintering said metal with silicon to form metal silicide rectifying contacts at least at the bottom of the trenches, whereby channel stoppers are formed solely by said deposited and sintered metal; and removing unreacted metal silicide.

9. The method of claim 8 wherein said metal is selected from the group comprising: palladium, platinum and the like.

10. The method of claim 9 wherein said metal is platinum deposited with a layer thickness in the range of 30–100 nm and sintered at about 550° C. to form a platinum silicide rectifying contact.

11. The method of claim 10 wherein said platinum silicide rectifying contact extends beyond the thickness of the inverted layer formed during said coating step.

12. The method of claim 10 wherein the thickness of said platinum silicide rectifying contact is the range of 50–150 nm.

* * * * *